United States Patent
Sonu et al.

(10) Patent No.: US 6,215,433 B1
(45) Date of Patent: Apr. 10, 2001

(54) DC INSENSITIVE CLOCK GENERATOR FOR OPTICAL PRML READ CHANNEL

(75) Inventors: Gene Sonu; Stanley Radzewicz, both of San Jose, CA (US)

(73) Assignee: Oak Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/343,114

(22) Filed: Jun. 29, 1999

(51) Int. Cl.[7] ............................. H03M 1/06; H03M 1/12; G11B 5/09

(52) U.S. Cl. ..................... 341/155; 341/155; 341/118; 341/120; 341/139; 369/48; 369/59

(58) Field of Search ................................. 341/118, 120, 341/139, 155; 369/48, 59; 327/105, 155, 299

(56) References Cited

U.S. PATENT DOCUMENTS

| | | | |
|---|---|---|---|
| 5,796,358 | * | 8/1998 | Shih et al. ............................. 341/139 |
| 5,818,656 | * | 10/1998 | Klaassen et al. ....................... 360/67 |
| 6,009,067 | * | 12/1999 | Hayashi ................................. 369/124 |
| 6,037,886 | * | 3/2000 | Staszewski et al. ................... 341/139 |
| 6,038,266 | * | 3/2000 | Lee et al. ................................. 375/317 |
| 6,078,444 | * | 6/2000 | Vishakhadatta et al. .............. 360/32 |

* cited by examiner

Primary Examiner—Michael Tokar
Assistant Examiner—Vibol Tan
(74) Attorney, Agent, or Firm—Pennie & Edmonds LLP (57) ABSTRACT

A clock generator for a PRML read channel for producing a clock signal with minimal jitter from an input signal subject to baseline wandering. The clock generator including a VGA amplifier, a low pass filter, an ADC, a baseline wander correction circuit, a timing offset detector and loop filter circuit, a DAC and a VCO. The VGA amplifier amplifies the input signal to produce a first analog signal. The low-pass filter filters the first analog signal to produce a second analog signal. The ADC converts the second analog signal into a first digital signal, operating synchronously with the clock signal. The baseline wander correction circuit reduces jitter in the clock signal caused by baseline wandering of the input signal. The baseline wander correction circuit produces a second digital signal from the first digital signal, operating synchronously with the clock signal. The second digital signal experiences substantially less baseline wandering than the first digital signal. The timing offset detector and loop filter circuit generates from the second digital signal a timing adjust signal representative of an adjustment to the clock signal. The timing offset detector also operating synchronously with the clock signal. The DAC converts the timing adjust signal into a third analog signal, operating synchronously with the clock signal. The VCO generates the clock signal in response to the third analog signal.

19 Claims, 6 Drawing Sheets

(Input to Baseline Wander Circuit)

FIG. 5A (Output from Baseline Wander Circuit)

DC INSENSITIVE CLOCK GENERATOR FOR OPTICAL PRML READ CHANNEL

The present invention relates generally to a clock generator for a DVD Player, and particularly to a clock generator for an Optical PRML Read Channel of a DVD Player.

BACKGROUND OF THE INVENTION

A DVD player plays back information stored on a DVD. DVD, an acronym for Digital Video Disc or Digital Versatile Disc, is a relatively new type of Compact-Disc Read-Only-Memory (CD-ROM). With a minimum capacity of approximately 4.7 gigabytes, a DVD can store a full length movie. A DVD player includes an Optical Pick-up Unit (OPU), a Read channel, and a digital video decoder. The OPU converts information read from the DVD into an analog RF signal. The Read Channel takes this RF signal and generates a digital data signal and a synchronous clock signal. The Read Channel couples these signals to a digital video decoder, which decodes the data and converts it into a video format compatible with a TV.

Previously, DVD Read Channels were implemented with analog technology. Analog implementation allows a Read Channel to remove the large DC component that typically forms part of the RF input signal from the OPU with relative ease and minor effect upon the data and clock signals. Unchecked, the low frequency disturbance of the RF input signal can cause the amplitude of the output signal to exceed the expected peak-to-peak amplitude, which can negatively impact the performance of the digital video decoder. Additionally, the baseline wandering resulting from low frequency disturbances of the RF input signal can cause so much clock jitter that the Read Channel phase lock loop (PLL) used to generate the clock may lose lock.

Various considerations now push toward a digital implementation of DVD Read Channels and, in particular, toward Partial Response Maximum Likelihood (PRML) Read Channels. Digital implementation requires a new approach to removing the low frequency disturbances of the RF input signal to the RF channel so that clock jitter does not cause the PLL to lose lock and so that the amplitude of the data signal conforms to a target spectrum.

SUMMARY OF THE INVENTION

The present invention is a clock generator for a Partial Response Maximum Likelihood (PRML) read channel, which produces a clock signal with minimal jitter from an input signal subject to baseline wandering. The clock generator of the present invention includes a Voltage Gain Amplifier (VGA), a low pass filter, an Analog-to-Digital Converter (ADC), a Baseline Wander Correction Circuit, a timing offset detector and loop filter circuit, a Digital-to-Analog Converter (DAC) and a Voltage Controlled Oscillator (VCO). The VGA amplifier amplifies the input signal to produce a first analog signal. The low-pass filter filters the first analog signal to produce a second analog signal. The ADC converts the second analog signal into a first digital signal, operating synchronously with the clock signal. The Baseline Wander Correction Circuitry reduces jitter in the clock signal caused by baseline wandering of the input signal. The Baseline Wander Correction Circuitry produces a second digital signal from the first digital signal, operating synchronously with the clock signal. The second digital signal experiences substantially less baseline wandering than the first digital signal. The timing offset detector and loop filter circuit generates from the second digital signal a timing adjust signal representative of an adjustment to the clock signal. The timing offset detector also operates synchronously with the clock signal. The DAC converts the timing adjust signal into a third analog signal, operating synchronously with the clock signal. The VCO generates the clock signal in response to the third analog signal.

BRIEF DESCRIPTION OF THE DRAWINGS

Additional objects and features of the invention will be more readily apparent from the following detailed description and appended claims when taken in conjunction with the drawings, in which:

DESCRIPTION OF THE INVENTION

Figure 1:
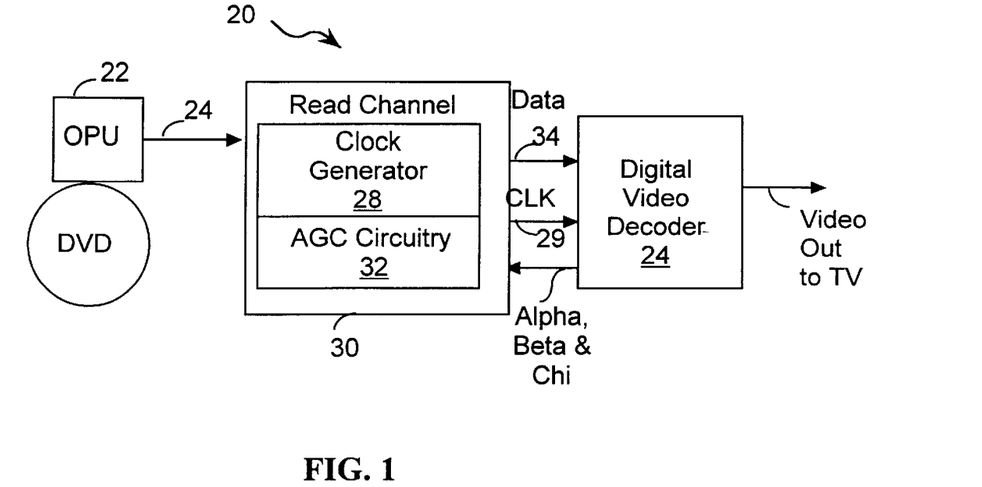
FIG. 1 illustrates a DVD player including the Read Channel Clock Generator of the present invention.

FIG. 1 illustrates, in block diagram form, DVD player 20, which includes OPU 22, Read Channel 30 and Digital Video Decoder 24. Read Channel 30 includes the Clock Generator 28 of the present invention, as well as Automatic Gain Control (AGC) Circuitry 32. Clock Generator 28 takes the RF input signal from OPU 22 on line 24 and generates a clock, the CLK signal, whose rising edges are synchronized to the gain controlled, digital, Partial Response Maximum Likelihood (PRML) Data signal output by Read Channel 30 on line 34. Even though implemented with digital technology, Clock Generator 28 manages to reduce jittering of its CLK signal caused by the low frequency disturbances of the RF input signal on the on line 24. Clock Generator 28 achieves this feat using Baseline Wander Correction Circuitry 48.

A. The Clock Generator

Figure 2:
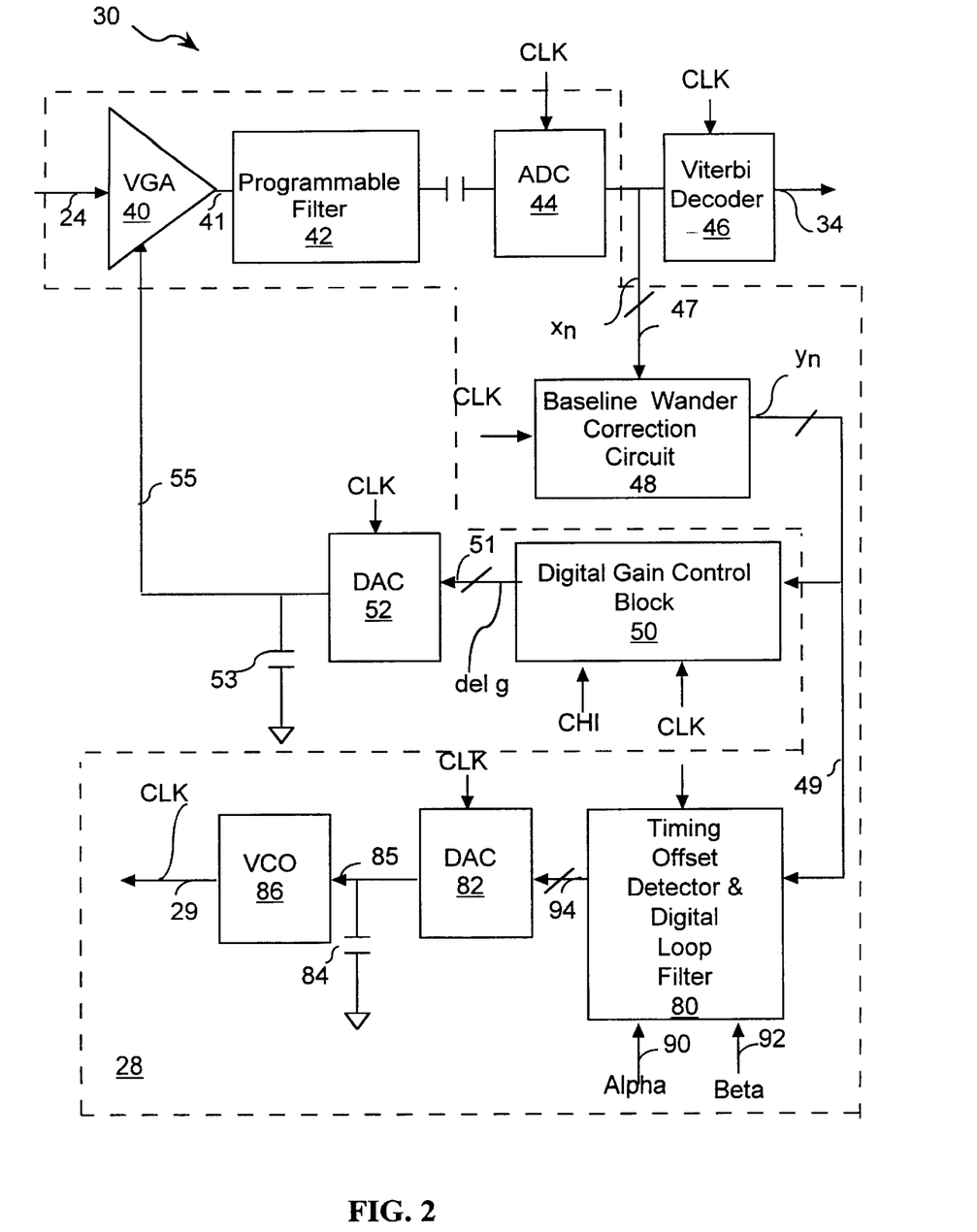
FIG. 2 illustrates the interrelationship of the Clock Generator of the present invention and the AGC Circuitry of a DVD Player Read Channel.

FIG. 2 illustrates, in block diagram form, the interrelationship of Clock Generator 28 and the AGC Circuitry of Read Channel 30. Clock Generator 28 shares with the AGC Circuitry 32 Voltage Controlled Gain Amplifier (VGA) 40, Programmable Filter 42, Analog-to-Digital Converter (ADC) 44, and Baseline Wander Correction Circuitry 48.

Additionally, Clock Generator 28 includes Timing Offset Detector & Digital Loop Filter 80, DAC 82 and Voltage Controlled Oscillator (VCO) 86. Clock Generator 28 is a phase locked loop (PLL). The PLL loop is closed by use of the CLK signal to clock ADC 44, Baseline Wander Correction Circuitry 48, Timing Offset Detector & Digital Loop Filter 80 and DAC 82. The remaining circuits in FIG. 2 are particular to the AGC Circuitry: Digital Gain Control Block 50 and DAC 52. The AGC Circuitry will be discussed following the discussion of Clock Generator 28.

VGA Amplifier 40 amplifies the RF input signal on line 24 by an amount controlled by a Gain Control Signal on line 55. The amplified RF signal on line 41 is then coupled to Programmable Filter 42. Programable Filter is a high order, low-pass filter. Preferably, the 3 dB cut-off frequency of Programmable Filter 42 is on the order of 1/(3T), where T represents the sampling interval of the clock signal, CLK. Preferably, Programmable Filter 42 also boosts the amplitude of the amplified RF signal by approximately 6 dB, depending upon the target spectrum. The gain of Programmable Filter 42 is programmable to allow adjustment for differing input signal characteristics from various OPU brands.

Figure 3A:
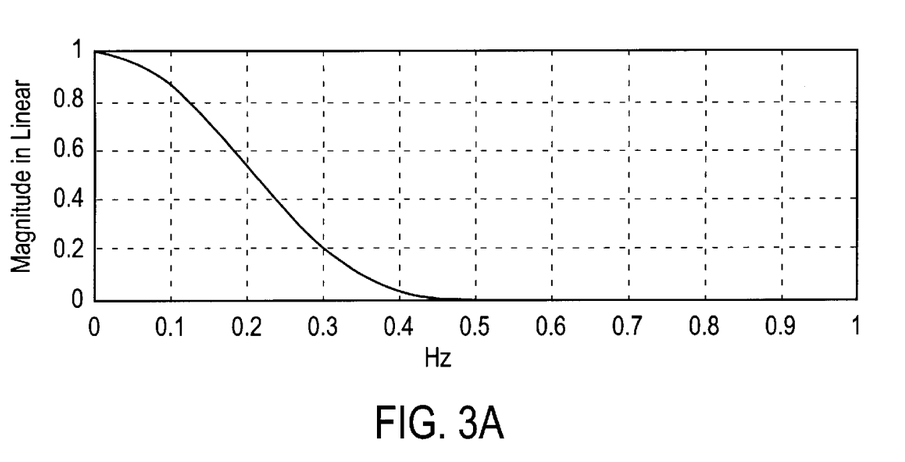
FIG. 3A illustrates the amplitude characteristic of the desired target input spectrum of $x_n$ for the Viterbi Decoder of the Read Channel, normalized for a channel bit period of one second.
Figure 3B:
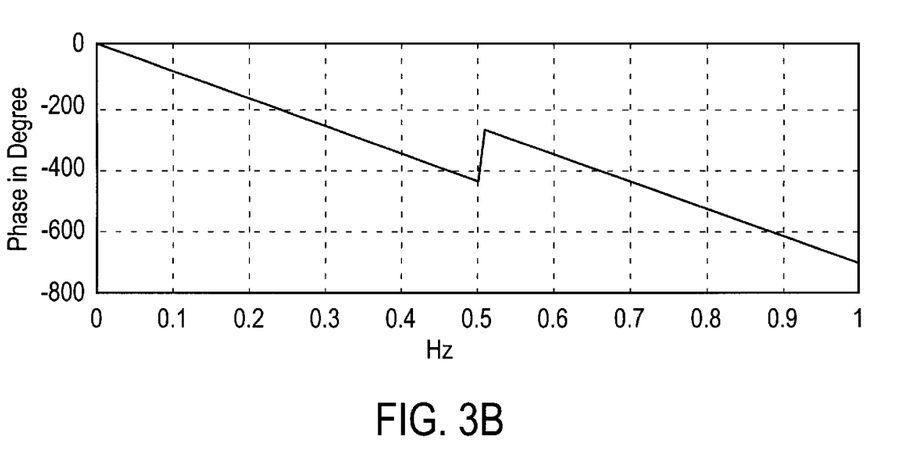
FIG. 3B illustrates the phase characteristic of the desired target input spectrum of $x_n$ for the Viterbi Decoder of the Read Channel, normalized for a channel bit period of one second.

The filtered and amplified RF signal output by Programable Filter 42 is then capacitively coupled to ADC 44. ADC 44 converts the analog RF signal into a digital signal, $x_n$, on line 47. In certain embodiments, the $x_n$ signal includes 5 or 6 bits. The $x_n$ signal is consistent with the target spectrum necessary to the normal operation of Viterbi Decoder 34. FIGS. 3A and 3B illustrate the amplitude and phase characteristics, respectively, of the desired target spectrum of $x_n$, normalized for a channel bit period of one second. As a result of this normalization the Nyquist frequency is 0.5 where the magnitude is null. The 3T/3T readback frequency is 1/6T. Note that FIG. 3B displays a linear relationship between phase and frequency.

From ADC 44 the $x_n$ signal on line 47 is coupled to Baseline Wander Correction Circuitry 48. Baseline Wander Correction Circuitry 48 significantly reduces DC components in the PLL loop used to generate the CLK signal on line 29. This leads to a significant reduction in the jitter of the CLK signal output by Clock Generator 28, which decreases the likelihood that the AGC Circuitry will lose lock.

Figure 4:
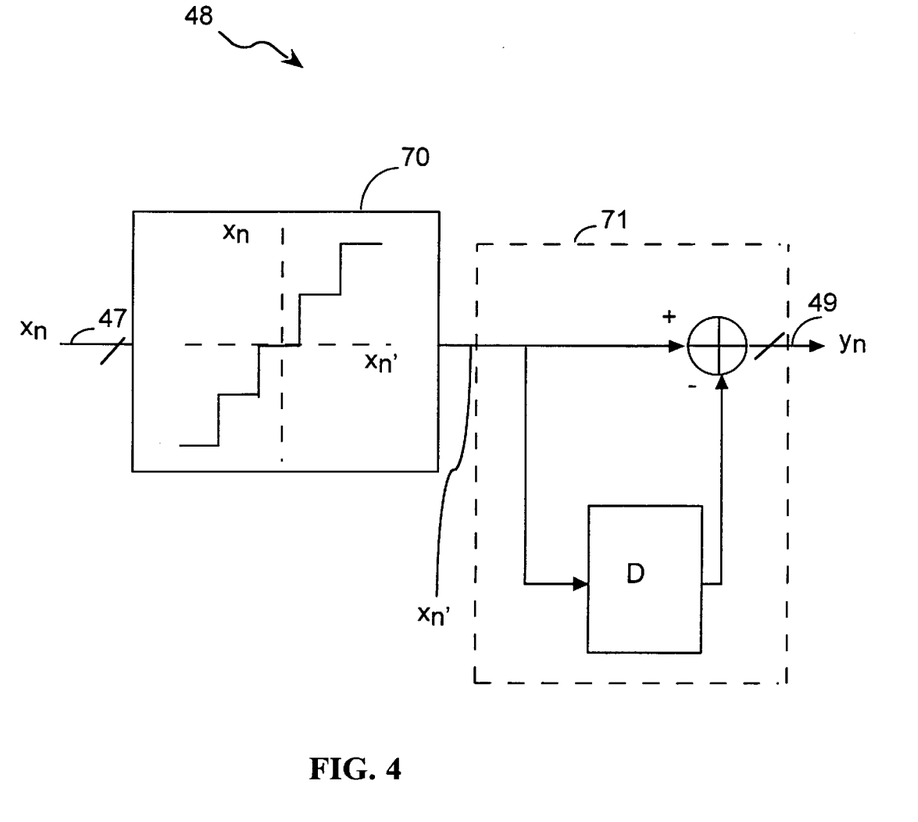
FIG. 4 illustrates a signal flow diagram for The baseline wander correction Circuitry of the Clock Generator of the present invention.

FIG. 4 illustrates a signal flow diagram for Baseline Wander Correction Circuitry 48, which includes Quantizer 70 and Correction Circuit 71. Quantizer 70 significantly reduces the noise of its input signal $x_n$ as compared to its output signal, $x_n'$, thereby improving the reliability of Clock Generator 28. Quantizer 70 generates the $x_n'$ signal from the $x_n$ signal on line 47 according to the following relationship:

$$x_n' = q * \text{round}(x_n/q); \tag{1}$$

where q represents a quantization interval; and "round" represents a rounding function.

The output signal, $y_n$, from Correction Circuit 71 can be expressed by the time based relationship:

$$y_n = x_n' - x_{n-1}'. \tag{2}$$

In the frequency domain, Correction Circuit 71 has a transfer function of:

$$H(\omega) = 1 - D; \tag{3}$$

where D represents the delay associated with a single sample interval T. Replacing D with $e^{-j\omega t}$ the transfer function becomes:

$$H(\omega) = 2e^{-j\omega T/2}(j\sin(\omega T/2)). \tag{4}$$

Relationship (4) demonstrates the phase relationship of the output signal, $y_n$, of Correction Circuit 71 to its input signal, $x_n'$. In addition to the constant 90° contributed by the j term, the magnitude of $y_n$ varies with frequency because of the $\sin(\omega T/2)$ term of Relationship (4).

Figure 5A:
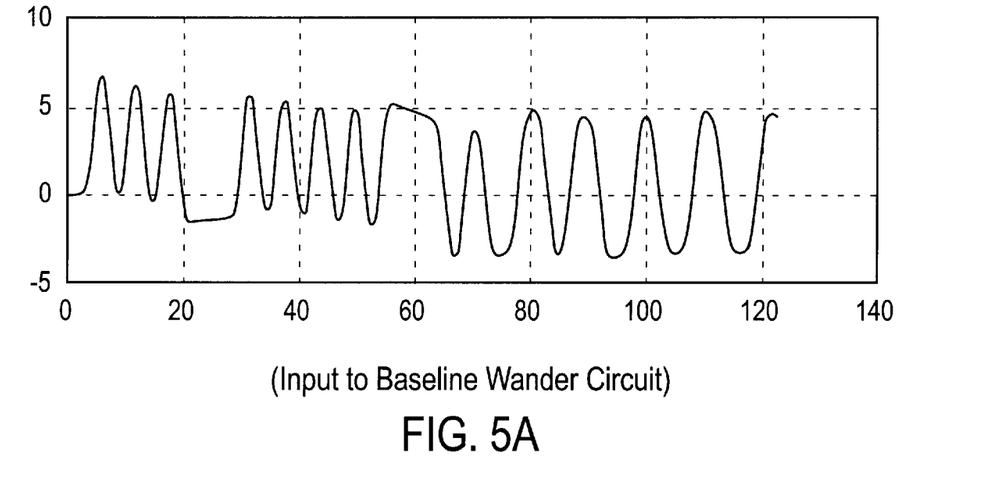
FIG. 5A illustrates hypothetical values for the $x_n$ signal input to the baseline wander correction circuitry.
Figure 5B:
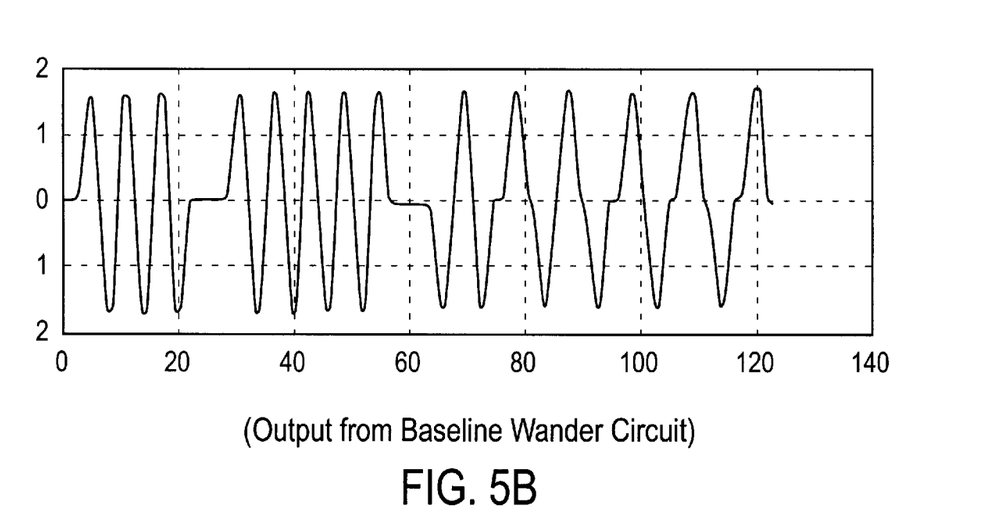
FIG. 5B illustrates hypothetical values for the $y_n$ signal output by The Baseline Wander Correction Circuitry in response to the input signal, $x_n$, of FIG. 5A.

FIG. 5A illustrates hypothetical values for the $x_n$ signal input to Baseline Wander Correction Circuitry 48. This hypothetical input signal suffers from baseline wandering—that is to say the average amplitude of the signal is not centered about some constant voltage level, but wanders about because of low frequency disturbances. FIG. 5B illustrates hypothetical values for the $y_n$ signal output by Baseline Wander Correction Circuitry in response to the input signal, $x_n$, of FIG. 5A. Baseline Wander Correction Circuitry 48 has eliminated the baseline wandering of its input from its output, whose average amplitude is constant and centered about 0 volts.

Use of Baseline Wander Correction Circuitry 48 confers an additional benefit upon Clock Generator 32 as compared to the same circuit without Baseline Wander Correction Circuitry 48. Baseline Wander Correction Circuitry 48 increases the reliability of DAC 82 by increasing the distance between adjacent sample points. In theory, the distance between adjacent sample points is increased by 33% by Baseline Wander Correction Circuitry 48 as compared to omitting Baseline Wander Correction Circuitry 48 from Read Channel 30. This makes it easier to estimate the error, $e_n$, between the actual $y_n$ signal and its ideal, the $\hat{y}_n$ signal, and improves the performance of Timing Offset Detector & Digital Loop Filter 80.

Figure 6:
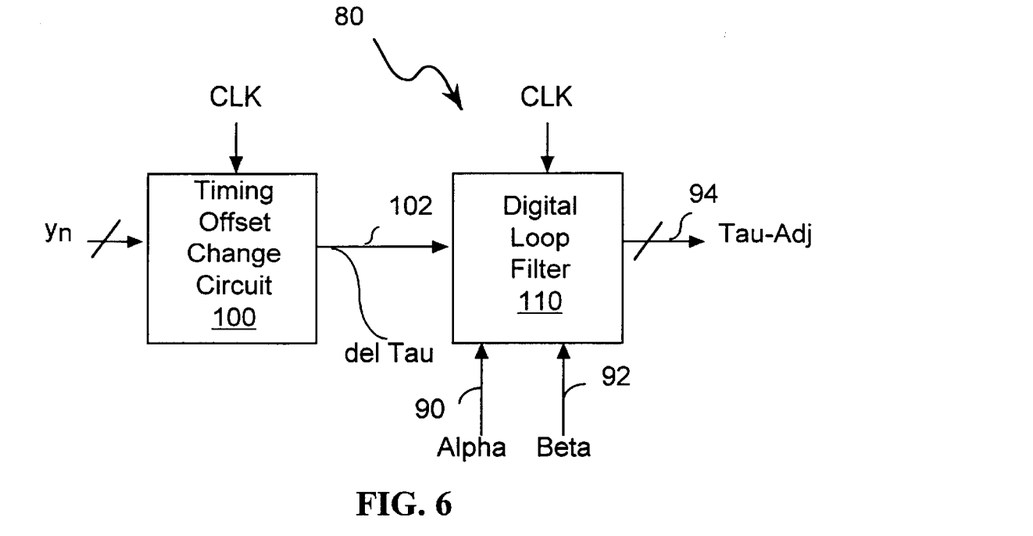
FIG. 6 illustrates the Timing Offset Detector & Loop Filter of the Clock Generator of the present invention.

Timing Offset Detector & Digital Loop Filter 80 adjusts the phase of the CLK signal based upon the output of the Baseline Wander Correction Circuitry 48, the $y_n$ signal. Timing Offset Detector & Digital Loop Filter 80 outputs the Tau-Adj signal, which represents the desired adjustment to the CLK signal. FIG. 6 illustrates, in block diagram form, Timing Offset Detector & Loop Filter 80, which includes Timing Offset Change Circuit 100 and Digital Loop Filter 110. Timing Offset Change Circuit 100 determines the timing offset between the $y_n$ signal and the ideal $\hat{y}_n$ signal and represents that offset via its output on line 102, the del Tau signal. The relationship between these three signals may be expressed as:

$$\text{del Tau} = (-y_n * \hat{y}_{n-1}) + (y_{n-1} * \hat{y}_n). \tag{5}$$

Figure 7:
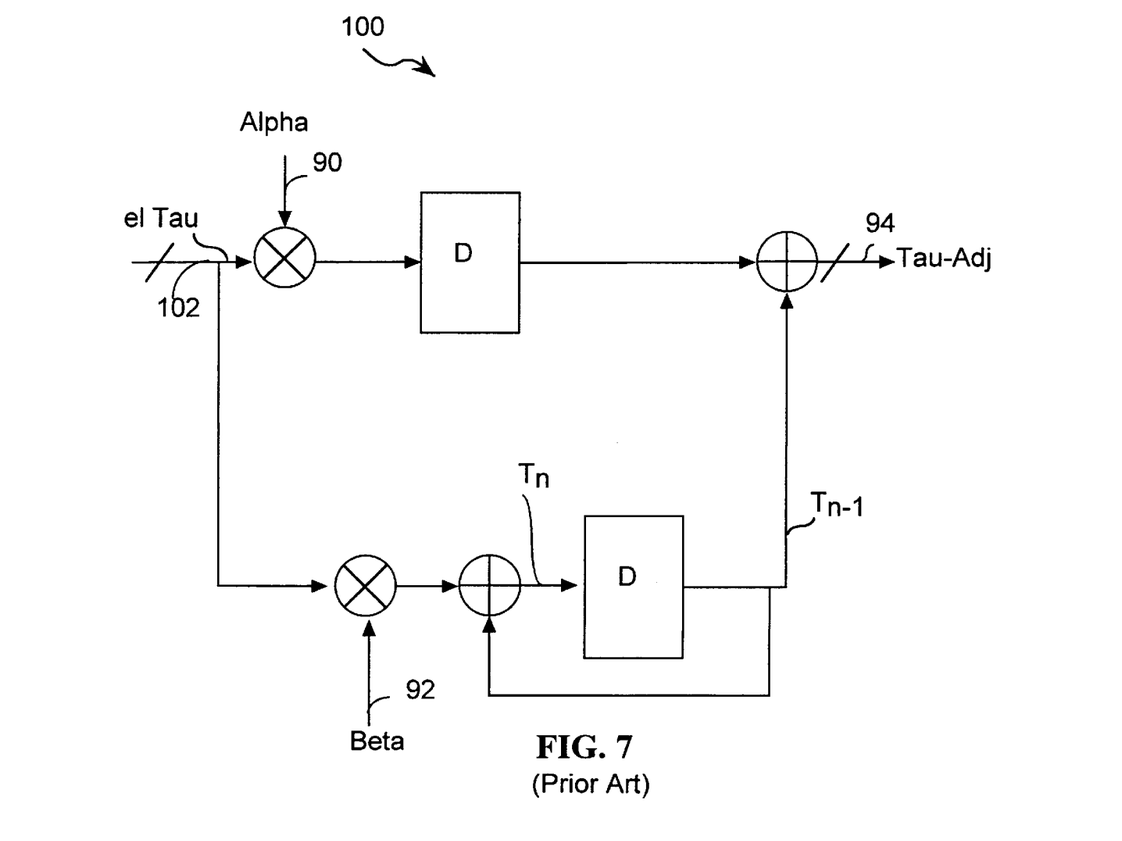
FIG. 7 is a signal flow diagram for the Digital Loop Filter of the Timing Offset Detector & Loop Filter of FIG. 6.

Digital Loop Filter 110 takes the timing offset and determines how the clock should be adjusted to more closely align the rising edges of the clock, CLK signal, to the transitions of the DATA signal on line 34. The output from Digital Loop Filter 110, the Tau-Adj signal on line 94, represents the desired adjustment to the CLK signal. FIG. 7 is a signal flow diagram for Digital Loop Filter 110, and Alpha and Beta are loop gain constants supplied by Digital Video Decoder 24. Note that Digital Loop Filter 110 is well known from its use in magnetic disc drive read channels, but it was not designed to deal with low frequency disturbances, such as baseline wandering. Baseline Wander Correction Circuitry 48 makes use of the Digital Loop Filter 110 possible by essentially eliminating baseline wandering.

Referring once again to FIG. 2, DAC 82 and capacitor 84 convert the Tau-Adj signal on line 94 into the analog signal input to VCO 86 on line 85. In response, VCO 86 adjusts the phase/frequency of the CLK signal, more closely synchronizing its rising edges to the transitions of the Data signal on line 34.

B. The AGC Circuitry

Figure 8:
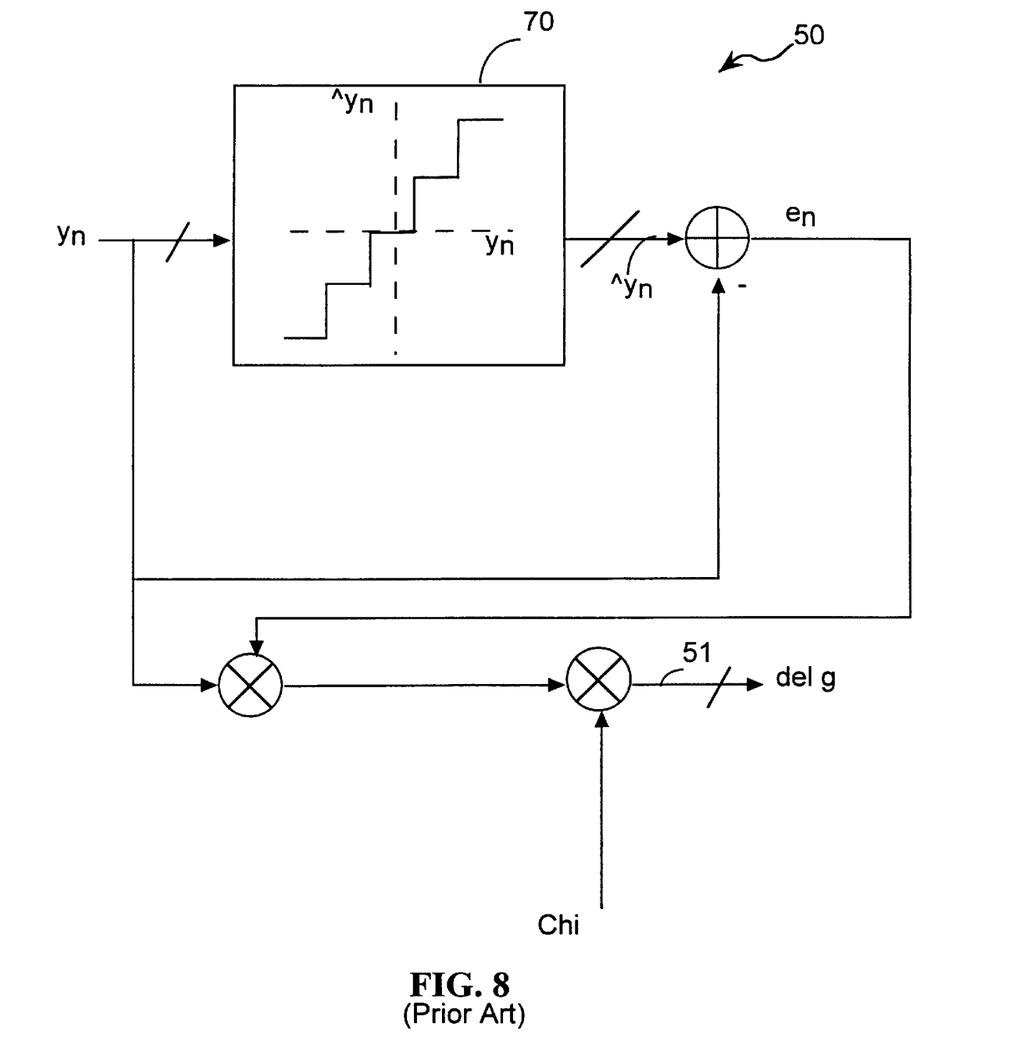
FIG. 8 illustrates a signal flow diagram for the Digital Gain Control Block of the Read Channel AGC Circuitry.

The Data Signal output by Read Channel 30 is generated by the AGC Circuitry. Reducing the jitter of CLK signal output by Clock Generator 28 helps maintain AGC lock. In addition to the circuits it shares with Clock Generator 28, the AGC Circuitry includes Digital Gain Control Block 50, DAC 52 and capacitor 53. Referring to FIG. 2, the output from Baseline Wander Correction Circuitry 48, the $y_n$ signal, is also coupled to Digital Gain Control Block 50. Digital Gain Control Block 50 uses this signal to determine how the gain of the VGA Amplifier 40 should be adjusted. FIG. 8 illustrates a signal flow diagram for Digital Gain Control Block 50, which produces between its input and output, the del g signal, a relationship of:

$$\text{del } g = \text{Chi}(e_n * y_n); \quad (6)$$

where Chi is the programmed ideal gain, whose value is provided by Digital Video Decoder 24.
As implied previously, $e_n$ can be expressed as:

$$e_n = \hat{y}_n - y_n. \quad (7)$$

Quantizer 70 generates the $\hat{y}_n$ signal from the $y_n$ signal according to the following relationship:

$$\hat{y}_n = q * \text{round}(\hat{y}_n/q); \quad (8)$$

where q represents a quantization interval; and "round" represents a rounding function.
Note that Digital Gain Control Block 50 is well known from its use in magnetic disc drive read channels and was not designed to deal with low frequency disturbances, such as baseline wandering. Chi is a loop gain constant, supplied by Digital Video Decoder 24. Baseline Wander Correction Circuitry 48 makes use of the Digital Gain Control Block 50 possible by essentially eliminating baseline wandering.

Referring once again to FIG. 2, DAC 52 and capacitor 53 convert the digital gain control signal, del g, into the analog Gain Control Signal input to VGA Amplifier 40 on line 55. Because the effects of baseline wandering have been substantially removed from the feedback path used to generate the Gain Control Signal, AGC Circuitry is more likely to maintain lock than would otherwise be the case.

Alternate Embodiments

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A clock generator for an optical Partial Response Maximum Likelihood (PRML) read channel for producing a clock signal with minimal jitter from an input signal subject to baseline wandering, comprising:

a. a Voltage Gain Amplifier (VGA) amplifier for amplifying the input signal to produce a first analog signal;

b. a low-pass filter for filtering the first analog signal to produce a second analog signal;

c. an Analog-to-Digital Converter (ADC) for converting the second analog signal into a first digital signal, the ADC operating synchronously with the clock signal;

d. a baseline wander correction circuit for reducing jitter in the clock signal caused by baseline wandering of the input signal, the baseline wander circuit including a quantizer circuit to reduce noise and a correction circuit executing a predetermined transfer function, the baseline wander correction circuit producing from the first digital signal a second digital signal, the second digital signal experiencing substantially less baseline wandering than the first digital signal, the baseline wander correction circuit operating synchronously with the clock signal;

e. a timing offset detector and loop filter circuit for generating from the second digital signal a timing adjust signal representative of an adjustment to the clock signal, the timing offset detector operating synchronously with the clock signal;

f. a Digital-to-Analog Converter (DAC) for converting the timing adjust signal into a third analog signal, the DAC operating synchronously with the clock signal; and g. a Voltage Controlled Oscillator (VCO) for generating the clock signal in response to the third analog signal.

2. The clock generator of claim 1 wherein said baseline wander correction circuit includes a quantizer that reduces noise in response to a predetermined rounding function.

3. The clock generator of claim 2 wherein said baseline wander correction circuit includes a correction circuit having a transfer function of $H(\omega)=1-D$, where D represents a delay associated with a single sampling interval, T, and $\omega$ represents frequency in radians per second.

4. The clock generator of claim 1 wherein the timing offset detector and loop filter circuit comprises:

a timing offset detector for generating a timing offset signal in response to the second digital signal, the timing offset signal representing a difference between the second digital signal and an ideal second digital signal; and a digital loop filter for generating the timing adjust signal in response to the timing offset signal.

5. A clock generator for an optical Partial Response Maximum Likelihood (PRML) read channel for producing a clock signal with minimal jitter from an input signal subject to baseline wandering, comprising:

a. a Voltage Gain Amplifier (VGA) amplifier for amplifying the input signal to produce a first analog signal;

b. a low-pass filter for filtering the first analog signal to produce a second analog signal;

c. an Analog-to-Digital Converter (ADC) for converting the second analog signal into a first digital signal, the ADC operating synchronously with the clock signal;

d. a baseline wander correction circuit for reducing jitter in the clock signal caused by baseline wandering of the input signal, the baseline wander correction circuit producing from the first digital signal a second digital signal, the second digital signal experiencing substantially less baseline wandering than the first digital signal, the baseline wander correction circuit operating synchronously with the clock signal, the baseline wander correction circuit having a transfer function of $H(\omega)=1-D$, where D represents a delay associated with a single sampling interval, T, and $\omega$ represents frequency in radians per second;

e. a timing offset detector and loop filter circuit for generating from the second digital signal a timing adjust signal representative of an adjustment to the clock signal, the timing offset detector operating synchronously with the clock signal;

f. a Digital-to-Analog Converter (DAC) for converting the timing adjust signal into a third analog signal, the DAC operating synchronously with the clock signal; and a Voltage Controlled Oscillator (VCO) for generating the clock signal in response to the third analog signal.

6. The clock generator of claim 5 wherein the low pass filter has a cut-off frequency of approximately 1/(3T), where T is a sampling interval.

7. The clock generator of claim 6 wherein the low pass filter boosts the first analog signal to produce the second analog signal.

8. The clock generator of claim 7 wherein the boost of the low pass filter is approximately 6 dB.

9. The clock generator of claim 5 wherein the timing offset detector and loop filter circuit comprises:

a timing offset detector for generating a timing offset signal in response to the second digital signal, the timing offset signal representing a difference between the second digital signal and an ideal second digital signal; and a digital loop filter for generating the timing adjust signal in response to the timing offset signal.

10. The clock generator of claim 9 wherein a relationship between the timing offset signal, del-Tau, and the second digital signal, $y_n$, is expressed by the relationship:

$$\text{del-Tau}_n = -y_n * \hat{y}_{n-1} + y_n * \hat{y}_n;$$

where $\hat{y}_n$ is the ideal second digital signal.

11. The clock generator of claim 9 wherein a relationship between the timing adjust signal, Tau-Adj, and the timing offset signal, del-Tau, is expressed by the relationship:

$$\text{Tau-Adj} = \text{Alpha} * \text{del-Tau}_{n-1} + T_{n-1};$$

where:

$$T_n = \text{Beta} * \text{del-Tau}_n + T_{n-1};$$

Alpha and Beta are constants; and

T is a sampling interval.

12. A clock generator for an optical PRML read channel for producing a phase-locked clock signal from an input signal subject to baseline wandering, comprising:

a. a VGA amplifier for amplifying the input signal to produce a first analog signal;

b. a low-pass filter for filtering and boosting the first analog signal to produce a second analog signal;

c. an ADC for converting the second analog signal into a first digital signal, the ADC operating synchronously with the clock signal;

d. a baseline wander correction circuit for reducing jitter in the clock signal caused by baseline wandering of the input signal, the baseline wander correction circuit producing from the first digital signal a second digital signal, the second digital signal experiencing substantially less baseline wandering than the first digital signal;

e. a timing offset detector for generating a timing offset signal representative of a difference between the second digital signal and an ideal second digital signal, the timing offset detector operating synchronously with the clock signal, the timing offset signal, del-Tau, the second digital signal, $y_n$, and the ideal second digital signal, $\hat{y}_n$, having a relationship expressed by:

$$\text{del-Tau}_n = -y_n * \hat{y}_{n-1} + y_n * \hat{y}_n;$$

f. a digital loop circuit for generating from the timing offset signal, del-Tau, a timing adjust signal, Tau-Adj, representative of an adjustment to the clock signal, the timing offset detector operating synchronously with the clock signal, del-Tau and Tau-Adj having a relationship expressed as:

$$\text{Tau-Adj} = \text{Alpha} * \text{del-Tau}_{n-1} + T_{n-1};$$

where:

$$T_n = \text{Beta} * \text{del-Tau}_n + T_{n-1};$$

and

Alpha and Beta are constants;

g. a DAC for converting the timing adjust signal into a third analog signal, the DAC operating synchronously with the clock signal; and h. a VCO for generating the clock signal in response to the third analog signal.

13. The clock generator of claim 9 wherein the low pass filter has a cut-off frequency of approximately 1/(3T).

14. The clock generator of claim 13 wherein the boost of the low pass filter is approximately 6 dB.

15. The clock generator of claim 13 wherein the baseline wander correction circuit includes:

a quantizer for reducing noise of the first digital signal, the quantizer having an input and an output, the input of the quantizer being coupled to the first digital signal; and a correction circuit for producing the second digital signal, the correction circuit having an input being coupled to the output of the quantizer, the correction circuit having a transfer function of $H(\omega) = 1-D$, where D represents a delay associated with a single sampling interval, T, and $\omega$ represents frequency in radians per second.

16. A method for generating a clock signal for an optical Partial Response Maximum Likelihood (PRML) read channel, the clock signal having minimal jitter and being produced from an input signal subject to baseline wandering, the method comprising:

a. amplifying the input signal to produce a first analog signal;

b. filtering the first analog signal to produce a second analog signal;

c. synchronously with the clock signal converting the second analog signal into a first digital signal;

d. synchronously with the clock signal reducing jitter in the clock signal caused by baseline wandering of the input signal by using a baseline wander correction circuit having a transfer function of $H(\omega) = 1-D$, where D represents a delay associated with a single sampling interval, T, and $\omega$ represents frequency in radians per second, to produce from the first digital signal a second digital signal, the second digital signal experiencing substantially less baseline wandering than the first digital signal;

e. synchronously with the clock signal generating from the second digital signal a timing adjust signal representative of an adjustment to the clock signal;

f. synchronously with the clock signal converting the timing adjust signal into a third analog signal; and a generating the clock signal in response to the third analog signal.

17. The method of claim 16 wherein generating from the second digital signal the timing adjust signal representative of the adjustment to the clock signal comprises:

generating a timing offset signal in response to the second digital signal, the timing offset signal representing a difference between the second digital signal and an ideal second digital signal; and generating the timing adjust signal in response to the timing offset signal.

18. The method of claim 17 wherein a relationship between the timing offset signal, del-Tau, and the second digital signal, $y_n$, is expressed by the relationship:

$$\text{del-Tau}_n = -y_n {}^*\hat{y}_{n-1} + \hat{y}_n {}^* y_n;$$

where $\hat{y}_n$ is the ideal second digital signal.

19. The method of claim 18 wherein a relationship between the timing adjust signal, Tau-Adj, and the timing offset signal, del-Tau, is expressed by the relationship:

$$\text{Tau-Adj} = \text{Alpha}^* \text{del-Tau}_{n-1} + T_{n-1};$$

where:

$$T_n = \text{Beta}^* \text{del-Tau}_n + T_{n-1};$$

Alpha and Beta are constants; and
T is a sampling interval.

* * * * *